United States Patent
Yamaguchi et al.

[11] Patent Number: 5,838,737
[45] Date of Patent: Nov. 17, 1998

[54] METHOD AND APPARATUS FOR ESTIMATING PSK MODULATED SIGNALS

[75] Inventors: Takahioro Yamaguchi; Shinsuke Tajiri, both of Sendai, Japan

[73] Assignee: Advantest Corporation, Tokyo, Japan

[21] Appl. No.: 663,847

[22] Filed: Jun. 14, 1996

Related U.S. Application Data

[62] Division of Ser. No. 538,943, Oct. 11, 1995, Pat. No. 5,590,158, which is a continuation of Ser. No. 186,603, Jan. 26, 1994, abandoned.

[30] Foreign Application Priority Data

Jan. 28, 1993 [JP] Japan ........................ 5-12304
Jan. 28, 1993 [JP] Japan ........................ 5-12305

[51] Int. Cl.$^6$ ............................ H03D 3/22; H04L 27/22
[52] U.S. Cl. ...................... 375/331; 375/332; 375/344; 329/304
[58] Field of Search ............................ 375/281, 283, 375/329–332, 344–345; 329/304, 345

[56] References Cited

U.S. PATENT DOCUMENTS

| | | | |
|---|---|---|---|
| 5,079,512 | 1/1992 | Muto | 329/304 |
| 5,187,719 | 2/1993 | Birgenheier et al. | 375/226 |
| 5,440,587 | 8/1995 | Ishikawa et al. | 375/332 |

OTHER PUBLICATIONS

International Publication No. WO 92/08307, Filed May 14, 1992; PCT/US91/07819; Richard A. Altes, La Jolla, CA.

*Primary Examiner*—Toung T. Tse

*Attorney, Agent, or Firm*—Staas & Halsey

[57] ABSTRACT

An in-phase component and a quadrature component of a digitized input DQPSK modulated signal are provided from interpolation filters, respectively. An instantaneous amplitude and an instantaneous phase of the input signal for each symbol clock are detected from the in-phase and quadrature components and are fed to adders. At the same time, that one of symbols "0, 0," "0, 1," "1, 0" and "1, 1" which corresponds to the instantaneous phase is detected by a symbol detector. An ideal reference signal generating part generates an ideal amplitude component and an ideal phase component corresponding to the detected symbol and provides them to a parameter calculating part. In an I-Q origin offset detecting part, an I-Q origin offset is calculated on the basis of the relationship between a triangle formed by the current detected vector corresponding to an ideal symbol and a vector detected one symbol clock before and a triangle formed by the said two vectors. An amplitude and a phase corresponding to the calculated I-Q origin offset are provided to the adders, respectively, and are corrected with respect to the detected instantaneous amplitude and phase, thereafter being fed to the parameter calculating part. In the parameter calculating part, a transmitter gain, and an amplitude variation, offset frequency and phase error per symbol clock are calculated.

5 Claims, 10 Drawing Sheets

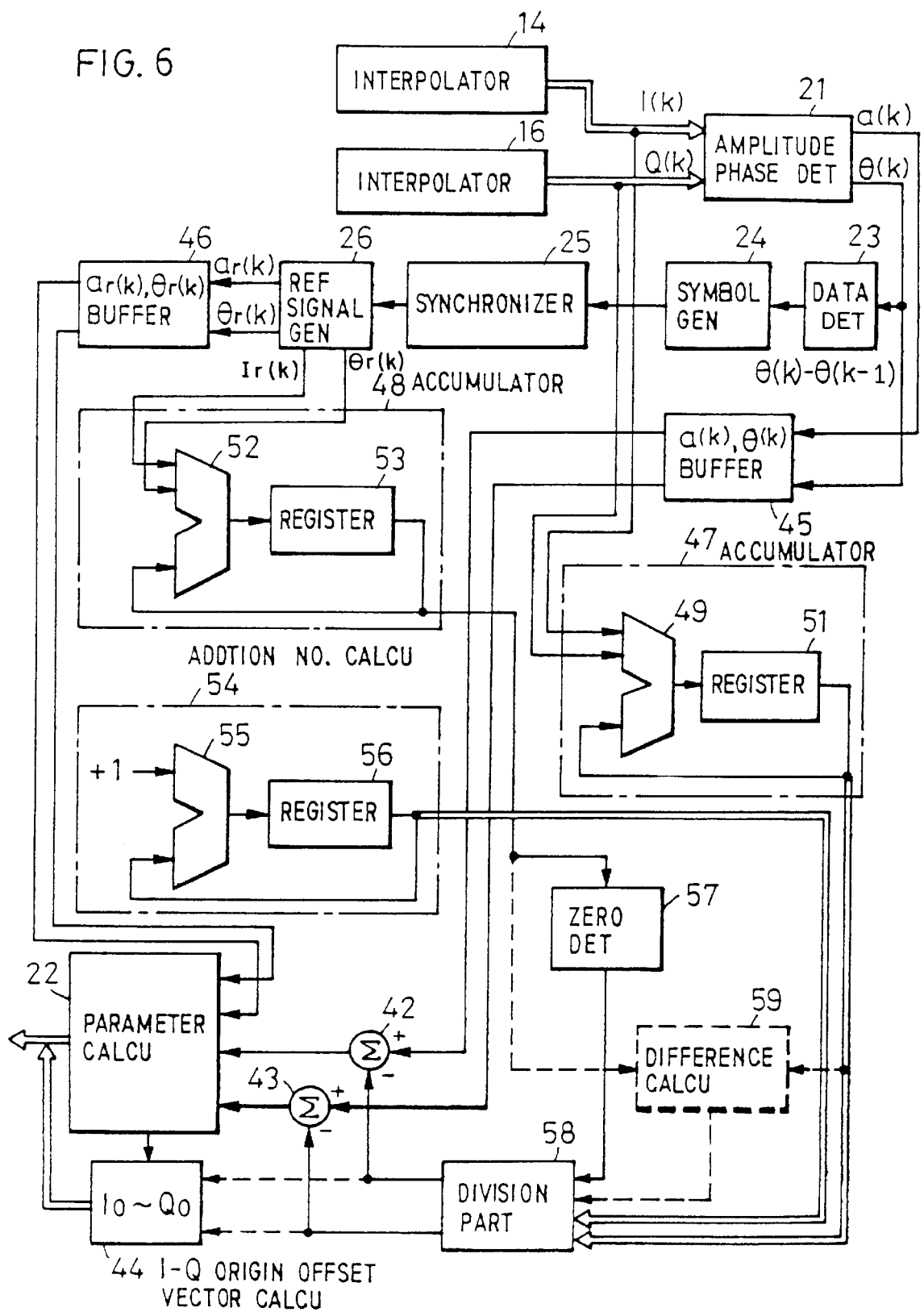

METHOD AND APPARATUS FOR ESTIMATING PSK MODULATED SIGNALS

This application is a division of application Ser. No. 08/538,943, filed Oct. 11, 1995, now U.S. Pat. No. 5,590,158, which is a continuation of Ser. No. 08/186,603, filed Jan. 26, 1994, now abandoned.

BACKGROUND OF THE INVENTION

The present invention relates to a method and apparatus for estimating PSK modulated signals such as BPSK, QPSK and DQPSK modulated signals, that is, for measuring or estimating the modulation accuracy of modulators which are used to generate these modulated signals, and an apparatus for detecting origin offsets of vectors composed of in-phase and quadrature-phase signals in the base-bands of these PSK modulated signals.

A conventional modulated signal estimating apparatus is disclosed in, for example, Raymond A. Birgenheier, "Measuring the Modulation Accuracy of π/4 DQPSK Signals for Digital Cellular Transmitters," Hewlett-Packard Journal, Vol. 42, No. 2, pp 73–82, April 1991 or U.S. Pat. No. 5,187,719 issued Feb. 16, 1993. A brief description will be given, with reference to FIG. 1, of this prior art modulated signal estimating apparatus. A DQPSK modulated signal, provided as an intermediate frequency signal to an input terminal 10, is converted by an analog-to-digital (A/D) converter 11 to digital data, which is fed via an intermediate frequency band-pass filter 12 to a burst detector 13, whereby only a signal portion is extracted. The thus extracted signal is applied to an interpolation filter 14 and a Hilbert transformer 15. The Hilbert transformer 15 produces, as its output, a quadrature component of the input signal thereto, and the quadrature component is fed to an interpolation filter 16. The output from the burst detector 13 is also applied to a baud rate phase detector 17, which detects a baud rate, that is, a phase difference τ between the center point of a symbol in the input modulated signal and a symbol clock used to determine the symbol. The phase difference τ is used to compensate the interpolation filters 14 and 16 which are FIR filters, for instance; their weight coefficients or functions are corrected in accordance with a deviation of an impulse response from an impulse train which is produced by unit delay arrays of the filters 14 and 16, that is, in accordance with the baud rate phase.

The in-phase component and the quadrature component output from the interpolation filters 14 and 16, respectively, are fed to adders 18 and 19, wherein in-phase and quadrature components of an I-Q origin offset are subtracted from them to obtain an in-phase component I(k) and a quadrature component Q(k). The component I(k) and Q(k) thus obtained are provided to an amplitude and phase detecting part 21, which computes an instantaneous amplitude $$a(k) = \sqrt{I(k)^2 + Q(k)^2}$$

and an instantaneous phase $\theta(k) = \tan^{-1}\{Q(k)/I(k)\}$ of a vector which are dependent on the in-phase and quadrature components. The instantaneous amplitude $a(k)$ and the instantaneous phase $\theta(k)$ are fed to a parameter calculating part 22, and the instantaneous phase $\theta(k)$ is provided to a data detector 23 as well, wherein $\theta(k)-\theta(k-5)$ calculated. In this example, k represents one data sample point, and one signal sampling period is selected to be equal to one-fifth of the symbol interval. Therefore, one symbol interval is equal to five sampling periods. That is, in this example, the in-phase component I(k) and the quadrature component Q(k) are provided every one-fifth of the symbol interval, and hence the instantaneous amplitude and the instantaneous phase are calculated every one-fifth interval of the symbol; the data detector 23 detects the difference between the current instantaneous phase and the instantaneous phase one symbol interval before, and the detected phase difference is used to estimate an ideal symbol of the modulated signal in a symbol generator 24. That is, the symbol generator 24 generates symbols "0, 0" for a phase difference 0° to 90°, "0, 1" for 90° to 180°, "1, 0" for −90° to 0° and "1, 1" for −180° to −90°, respectively. The symbols thus obtained are correlated with a unique 28-bit synchronization word in a synchronizer 25 to establish the word interval. The output from the synchronizer 25 is fed to a reference signal generating part 26, which generates a reference instantaneous amplitude $a_r(k)$ and a reference instantaneous phase $\theta_r(k)$ corresponding to the ideal reference vector, dependent on the estimated symbols, and provides them to the parameter estimator or calculating part 22.

The parameter calculating part 22 calculates values of parameters $A_0$, $\sigma_0$ and $\Omega_0$ that minimize a linear approximation expression of the square mean value of an error vector given by the following equation (1).

$$\overline{\epsilon^2} = \Sigma a(k)a_r(k)\exp(\sigma_0 k)\{[\ln A_0 + \sigma_0 k + \ln a(k) - \ln a_r(k)]^2 + [\theta(k) - \theta_r(k) - \Omega_0 k - \theta_0]^2\} \quad (1)$$

In the above, the parameter $A_0$ is a transmitter gain, $\sigma_0$ is a droop factor (an amplitude variation per symbol), $\Omega_0$ is an offset frequency (a phase variation per symbol) and $\theta_0$ is a phase error. These parameters are used to calculate an in-phase component $I_0$ and a quadrature component $Q_0$ of an I-Q origin offset $B_0$ by the following equations (2) and (3).

$$I_0 = (1/N)\Sigma\{A_0 a(k)\exp(\sigma_0 k)\cos[\theta(k) - \Omega_0 k - \theta_0] - a_r(k)\cos\theta_r(k)\} \quad (2)$$

$$Q_0 = (1/N)\Sigma\{A_0 a(k)\exp(\sigma_0 k)\sin[\theta(k) - \Omega_0 k - \theta_0] - a_r(k)\sin\theta_r(k)\} \quad (3)$$

In the equations (2) and (3), Σ is from k=0 to N−1 and N is the number of decided symbols.

In the event that the I-Q origin offsets $I_0$ and $Q_0$ thus calculated are larger than a threshold value, they are multiplied by $(1/A_0)\exp\{-\sigma_0 k+j(\Omega_0 k+\theta_0)\}$ in a multiplier 96. The in-phase component (a real part) is subtracted by the adder 18 from the output of the interpolation filter 14, and the quadrature component is subtracted by the adder from the output of the interpolation filter 16. The outputs from the adders 18 and 19 are individually processed as the in-phase component I(k) and the quadrature component Q(k) in the same fashion as described previously, and the equations (1) through (3) are performed by the parameter calculating part 22. Thereafter, the same process as mentioned above is repeated until it is decided in a decision part 27 that the I-Q origin offset $B_0$ is smaller than the threshold value.

When the origin offsets $I_0$ and $Q_0$ become smaller than the threshold values as the result of such a repetition of the calculations, the parameters $A_0, \sigma_0$ and $\Omega_0$ obtained at that time in the parameter calculating part 22 are provided to a local carrier oscillator 28, which generates a local carrier signal $A_0\exp\{\sigma_0 k-j[\Omega_1+\Omega_0)k+\theta_0]\}$ dependent on the parameters, where $\Omega_1$ is the frequency of the intermediate frequency signal to the input terminal 10. A sine-wave and a cosine-wave signal from the local carrier oscillator 28 are multiplied by the output from the interpolation filter 14 in multipliers 29 and 31, that is, the input DQPSK signal undergoes an orthogonal detection. The outputs from the multipliers 29 and 31 are fed to adders 32 and 33, wherein the in-phase component $Re(B_0)=I_0$ and the quadrature component $Im(B_0)=Q_0$ of the I-Q origin offset obtained in the parameter calculating part 22 are subtracted from the above-mentioned multiplier outputs. The outputs from the adders 32 and 33 are passed through low-pass filters (square root raised cosine filters) 34 and 35 to obtain a modulated signal of the transmitted signal (the input signal), that is, in-phase and quadrature components of the baseband signal. The in-phase component I(k) and the quadrature component Q(k) are provided to the amplitude and phase detecting part 21, whereby an instantaneous amplitude and an instantaneous phase are detected as described previously. Furthermore, the difference in the instantaneous phase every symbol interval is detected and a symbol is estimated. An ideal reference instantaneous amplitude and an ideal reference instantaneous phase corresponding to the estimated symbol are produced and provided to the parameter calculating part 22. Moreover, the instantaneous amplitude and the instantaneous phase detected by the amplitude and phase detecting part 21 are also supplied to the parameter calculating part 22, wherein various parameters are calculated as referred to previously. Where the thus obtained parameters differ from those produced previously, the above operation is repeated.

In this way, refined parameters are decided and are used to again control the local carrier oscillator 28, and the sine-wave and cosine-wave signals from the local carrier oscillator 28 are fed to the multipliers 29 and 31 and multiplied by the outputs from the interpolation filters 14 and 16, respectively, whereby the in-phase and quadrature components are detected. A difference between the vector composed of such detected in-phase and quadrature components and an ideal reference vector $Sr(k)=Ar(k)exp\{j\theta_r(k)\}$ from the reference signal generating part 26 is calculated in an error vector calculating part 39 and a mean value of the error vector is calculated. The mean value represents the modulation accuracy. That is, it is the modulation accuracy that is obtained by averaging the error vector 38 between a detected vector 36 $[A_0exp\{\sigma_0k-j(\Omega_0k+\theta_0)\}Z(k)]$ compensated in timing, amplitude, frequency, phase and dc offset with respect to the vector Z(k) of the baseband signal of the input modulated signal and an ideal reference vector 37 $\{Sr(k)\}$ on an I-Q plane coordinates as shown in FIG. 2. The modulation accuracy thus obtained and the parameters $\Omega_0$, $\sigma_0$, $I_0$ and $Q_0$ calculated by the parameter calculating part 22 are displayed on a display 40.

FIG. 3 shows the signal processing procedure of the traditional modulation accuracy estimating apparatus described above. In step S1 the equation (1) is computed by the least squares method using the linear approximation on the assumption that the I-Q origin offset $B_0$ is zero. The resulting parameters $A_0$, $\sigma_0$, $\theta_0$ and $\Omega_0$ are used to calculate the equations (2) and (3) to obtain the I-Q-origin offset $B_0$ (S2). If the I-Q origin offset $B_0$ thus obtained is smaller than the threshold value (S3), and if larger than the threshold value, the I-Q origin offset is multiplied by $(1/A_0)exp(-\sigma_0k+j(\Omega_0k+\theta_0))$ (S4), and the multiplied output is used to correct the outputs from the interpolation filters 14 and 16 (S5). The same steps as mentioned above are repeated for the corrected result, and they are repeated until the I-Q origin offset $B_0$ becomes smaller than the threshold value. When the I-Q origin offset $B_0$ becomes smaller than the threshold value, coherent demodulation, that is, the same operation as demodulation in an ordinary receiver is conducted (S6). Conventionally, the I-Q origin offset $B_0$ is assumed to be zero at first and the parameters are estimated by linear approximation as described above, hence it is necessary to repeat the calculations until correct parameters are obtained. Thus, the processing time is inevitably long and, in some cases, optimal results cannot be obtained even after repeating the calculations.

It is therefore an object of the present invention to provide a PSK modulated signal estimating method and apparatus which permit measurement of the modulation accuracy in a shorter time than in the prior art.

Another object of the present invention is to provide a PSK modulated signal estimating method and apparatus which permit measurement of the modulation accuracy in a shorter time than in the prior art even if the frequency difference between the input modulated signal and the local carrier is relatively large.

SUMMARY OF THE INVENTION

According to the present invention, an I-Q origin offset is obtained from in-phase and quadrature components of an input modulated signal and an estimated ideal reference symbol. The I-Q origin offset thus obtained is subtracted from an instantaneous amplitude and an instantaneous phase to correct them, and the amplitude $A_0$, frequency error $\Omega_0$, droop factor $\sigma_0$ and phase error $\theta_0$ of the input signal are derived from the corrected instantaneous amplitude and instantaneous phase and the estimated ideal reference symbol.

An ideal in-phase and quadrature components corresponding to the estimated ideal symbol are calculated and these ideal in-phase and quadrature components are respectively accumulated. At the same time, in-phase and quadrature components detected from the input signal are respectively accumulated. The difference between the both accumulated values is obtained and divided by the number of accumulations to obtain the I-Q origin offset.

Over those of all possible signal points whose sum is zero, the detected in-phase and quadrature components are respectively accumulated, and when such signal points have appeared the same number of times, the accumulated values over these original points are divided by the number of accumulations to obtain the I-Q origin offset.

All ideal in-phase and quadrature components corresponding to an estimated ideal symbol are respectively accumulated, and at the same time, detected in-phase and quadrature components are respectively accumulated. When it is detected that the accumulated values of the ideal in-phase and quadrature components become zero, the accumulated values of the detected in-phase and quadrature components at that time are each divided by the number of accumulations to obtain the I-Q origin offset.

An ideal I-Q origin is derived from instantaneous amplitudes and instantaneous phases which are one symbol interval apart and phase variations of estimated ideal symbols corresponding to them, and the difference between the thus obtained ideal I-Q origin O and an I-Q origin O' of the detected vector determined the above-mentioned instantaneous amplitudes and phases is computed to obtain the I-Q origin offset.

The amplitude A, and the frequency difference $\Omega_0$ of the modulated signal are derived from the detected vector $Z(k)=I(k)+jQ(k)$ which is determined by the detected in-phase and quadrature components I(k) and Q(k), the detected vector Z(k−n) n (where n is an integer equal to or greater than 1) symbol clocks before, and an accumulated phase difference $\phi_k$ between ideal symbols corresponding to the detected vectors. The amplitude $A_0$ and the frequency difference $\Omega_0$ thus obtained are used to correct the amplitude and phase of the detected vector Z(k), and the phase difference $\theta_0$ and the I-Q origin offset $B_0$ and, if necessary, the droop factor $\sigma_0$ are calculated from the corrected detected vector and the ideal vector. The amplitude $A_0$ and frequency difference $\Omega_0$ are derived from an amplitude and a phase angle, respectively, obtained by calculating the complex correlation of the detected vector, a complex conjugate of the detected vector one symbol clock before and the phase difference between these ideal symbols corresponding to these detected vectors.

BRIEF DESCRIPTION OF THE DRAWINGS

FIG. 6 is a block diagram illustrating a specific operative example of an I-Q origin offset detecting part 41 in FIG. 4;

DESCRIPTION OF THE PREFERRED EMBODIMENTS

Figure 1:
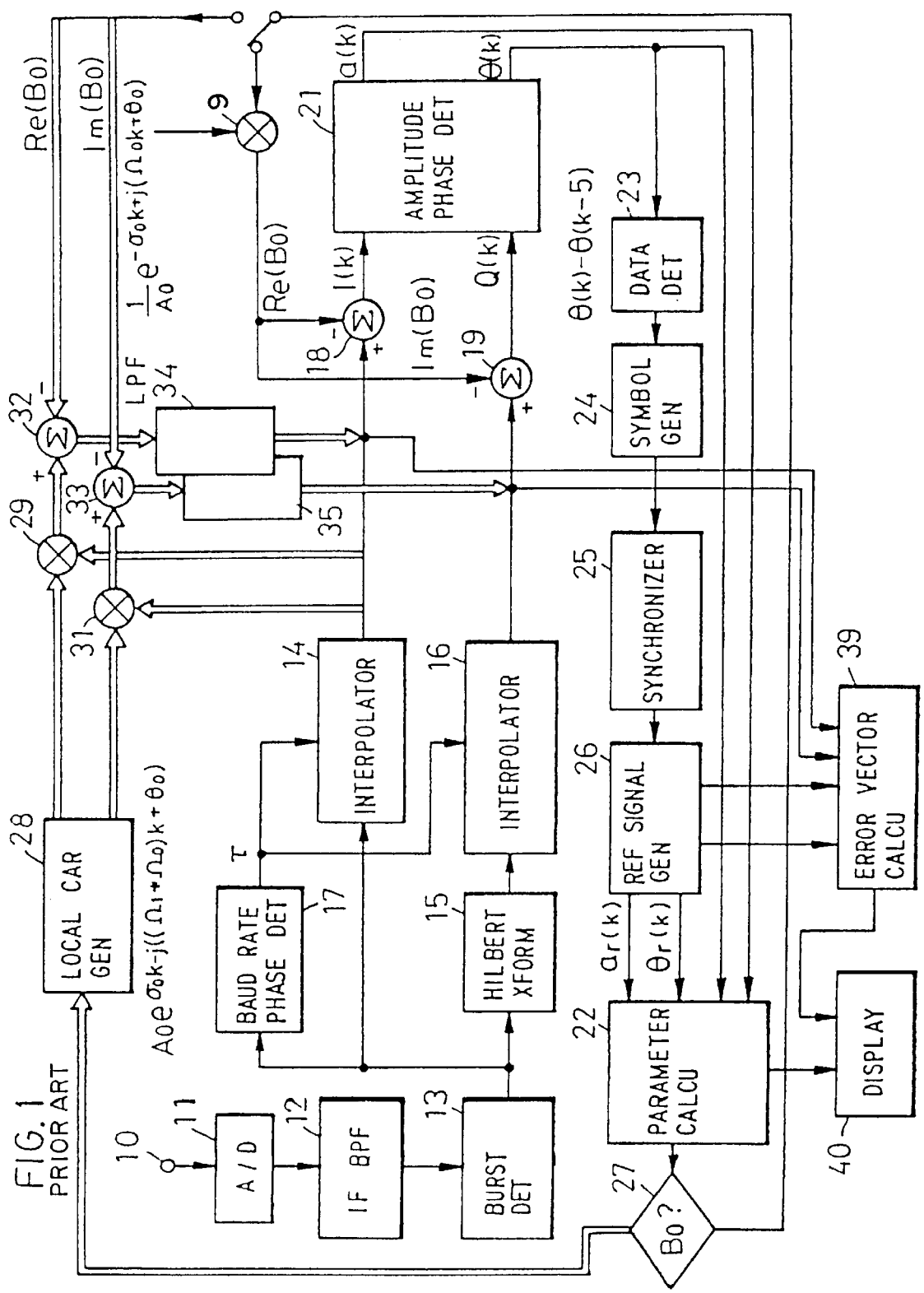
FIG. 1 is a block diagram showing a conventional DQPSK modulated signal estimating apparatus.
Figure 4:
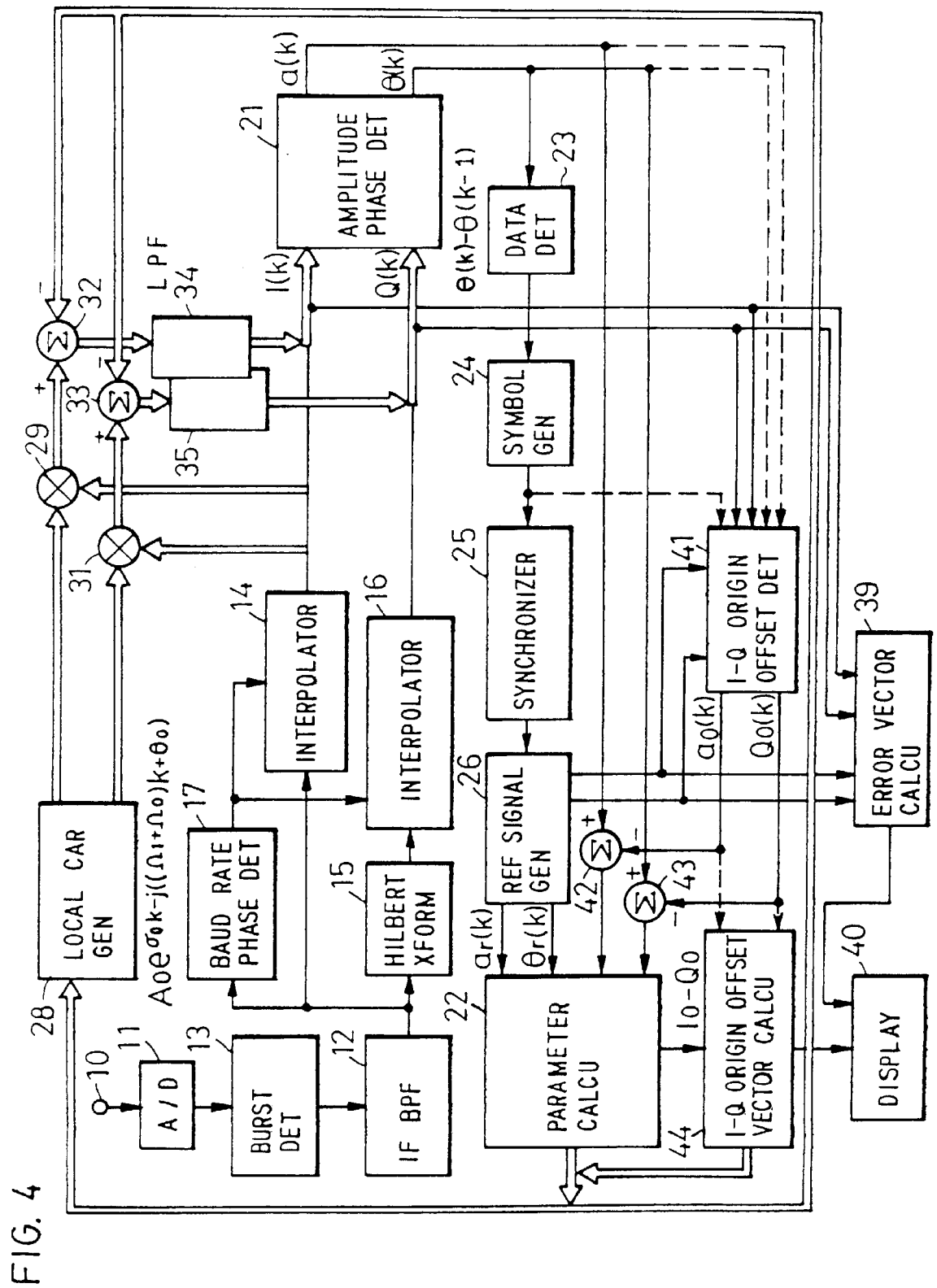
FIG. 4 is a block diagram illustrating an embodiment of the apparatus according to the present invention.

FIG. 4 illustrates in block form an embodiment of the present invention, in which the parts corresponding to those in FIG. 1 are identified by the same reference numerals. According to the present invention, the I-Q origin offset $B_0$ is detected in the I-Q origin offset detecting part 41. While the method for this detection will be described later on, at least the in-phase component I(k) and the quadrature component Q(k) from the interpolation filters 14 and 16 are used. The amplitude $a_0(k)$ of the detected I-Q origin offset $B_0$ and its phase $\theta_0(k)$ are input into adders 42 and 43, respectively, wherein they are subtracted from the instantaneous amplitude a(k) and the instantaneous phase $\theta(k)$ detected in the amplitude and phase detecting part 21 to correct the instantaneous amplitude a(k) and the instantaneous phase $\theta(k)$, and the corrected signals fed to the parameter calculating part 22. The parameter calculating part 22 calculates parameters which minimize the error in the equation (1) as described previously in connection with FIG. 1. The in-phase component $I_0$ and the quadrature component $Q_0$ of the I-Q origin offset are computed in an I-Q origin offset vector calculating part 44 by the afore-mentioned equations (2) and (3) through utilization of the parameters available from the parameter calculating part 22; alternatively, they are computed from the amplitude $a_0(k)$ and the phase $\theta_0(k)$ of the I-Q origin offset detected by the I-Q offset detecting part 41. As in the prior art, the in-phase component $I_0$ and the quadrature component $Q_0$ of the I-Q origin offset vector thus obtained are fed to the adders 32 and 33, and the parameters calculated in the parameter calculating part 22 are fed to the local carrier generator 28 to generate sine and cosine waves of the local carrier. Thus, according to the present invention, the I-Q origin offset is detected in the I-Q offset detecting part 41 at first, the instantaneous amplitude and phase detected by the detector 21 are corrected by the I-Q origin offset, and the parameters $A_0$, $\sigma_0$, $\Omega_0$ and $\theta_0$ are calculated using the corrected instantaneous amplitude and phase; hence, no repetitive calculation is needed. In this embodiment of the present invention, k represents one symbol point and one data sampling period is equal to the symbol interval.

Figure 2:
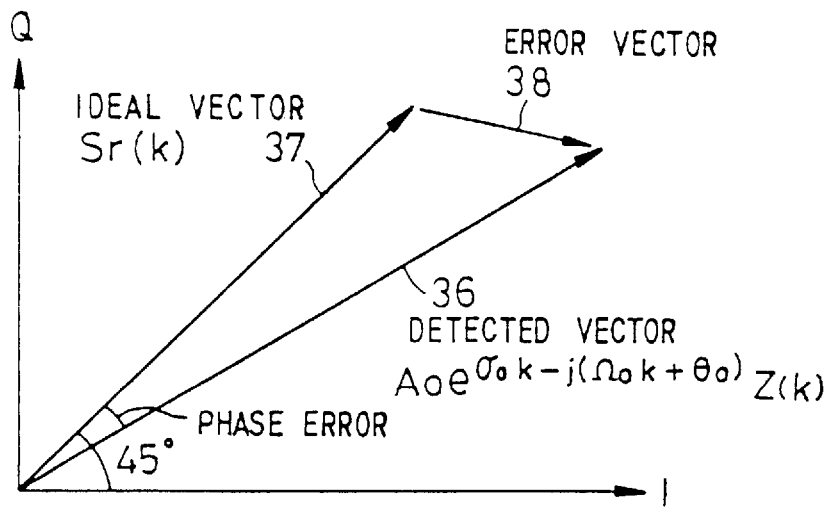
FIG. 2 is a graph showing the relationships of detected, ideal and error vectors.
Figure 3:
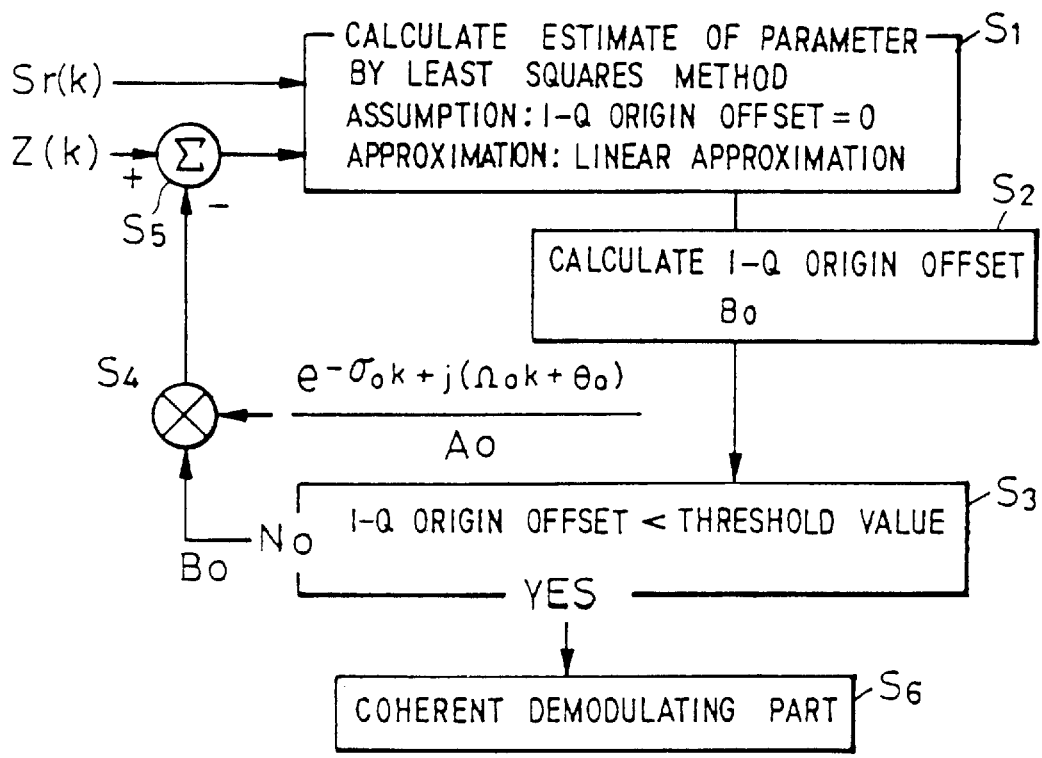
FIG. 3 is a flowchart showing a signal processing procedure in the conventional apparatus.
Figure 5:
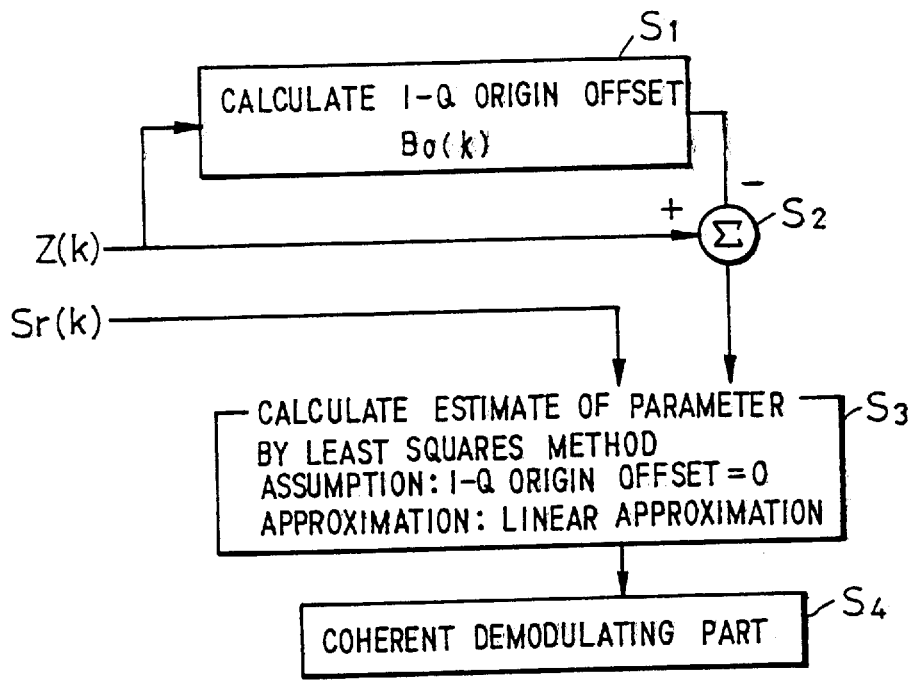
FIG. 5 is a flowchart showing a signal processing procedure in the apparatus of the FIG. 4 embodiment.

FIG. 5 shows the parameter estimation algorithm according to the present invention which corresponds to that shown in FIG. 2. The process begins with the calculation of the I-Q origin offset $B_0(k)$ (S1), followed by the correction of the detected vector Z(k) by use of the I-Q origin offset $B_0k$ (k) (S2) and then by calculating estimates of the parameters by the least squares method using the corrected detected vector and the reference vector Sr(k) (S3). The calculated results are used to perform the coherent demodulation (S4). Although the calculations need to be repeated at least twice in the prior art, they need not be repeated in the present invention.

Next, a description will be given of a specific operative example of the I-Q origin offset detecting part 41. As shown in FIG. 6 wherein the parts corresponding to those in FIG. 4 are identified by the same reference numerals, the instantaneous amplitude a(k) and the instantaneous phase $\theta(k)$ detected in the amplitude and phase detecting part 21 are stored in a signal buffer 45. On the other hand, the ideal instantaneous amplitude and phase $a_r(k)$ and $\theta_r(k)$ available from the ideal reference signal generating part 26 are temporarily stored in an ideal signal buffer 46. Furthermore, the in-phase component I(k) and the quadrature component Q(k) from the interpolation filters 14 and 16 are accumulated in an accumulator 47, and those of the in-phase component $I_r(k)=a_r(k)\cos\theta_r(k)$ and the quadrature component $Q_r(k)=a_r(k)\sin\theta_r(k)$ of the ideal vector $S_r(k)$ from the ideal reference signal generating part 26 which are synchronized with the in-phase component I(k) and the quadrature component Q(k) mentioned above, that is, which coincide with the latter in the number k, are accumulated in an accumulating part 48. These accumulations are vector additions, and the respective in-phase components are accumulated and the respective quadrature components are accumulated. In the accumulating part 47 signals from the interpolation filters 14, 16 and a register 51 are vector added by an adder 49 and the respective added values of the in-phase and the quadrature components are stored in the register 51. Similarly, in the accumulating part 48 signals from the ideal reference signal generating part 26 and a register 53 are added by an adder 52 and the respective added values of the in-phase and the quadrature components are stored in the register 53. To count the number of accumulations, an accumulation number counter 54 is provided. That is, a number 1 and the value from a register 56 are added by an adder 55 in synchronization with the accumulation by the accumulators 47 and 48, and the adder output is stored in the register 56. Hence, the register 56 is incremented by one upon each accumulation of the accumulators 47 and 48 to store the number of accumulations. The registers 51, 53 and 56 are initially reset to zero.

The sum of all in-phase and quadrature components at so-called signal points that each symbol of the modulated signal or the transmitted signal (the input signal) assumes is zero. Hence, the state in which the content of the register 53 is zero is detected by a zero detecting part 57, and the accumulated value by the accumulating part 47 or the contents of the register 51 at that time are fed into a dividing part 58 and the number of accumulations stored in the register 56 of the accumulation number counting part 54 is also fed into the dividing part 58. The dividing part 58 divides the accumulated value by the number of accumulations, and the divided output is used as the I-Q origin offset $B_0(k)=I_0(k)+jQ_0(k)$ of the detected signal $Z(k)$. Furthermore, the dividing part 58 calculates and provides the amplitude $$a_0(k) = \sqrt{I_0(k)^2 + Q_0(k)^2}$$

and the phase $\theta_0(k)=\tan^{-1}\{Q_0(k)/I_0(k)\}$ of the I-Q origin offset to the adders 42 and 43, respectively, wherein they are corrected with respect to the instantaneous amplitude $a(k)$ and the instantaneous phase $\theta(k)$ available from the instantaneous signal buffer 45, and the components $a_r(k)$ and $\theta_r(k)$ of the same k number from the ideal signal buffer 46 are fed to the parameter calculating part 22.

In this way, the ideal vector $S_r(k)$ is accumulated in the accumulating part 48, and when the ideal vector has been accumulated an equal number of times at respective signal points, this state is detected by the zero detecting part 57. At this time, the center of the accumulated ideal vector is zero (at the origin), and the accumulated value of the accumulating part 47, that is, the center O' of the accumulated vector is an offset from the origin. Since this value has become large by the number of accumulations, the value obtained by dividing it with the number of accumulations is the I-Q origin offset $B_0$.

Figure 7:
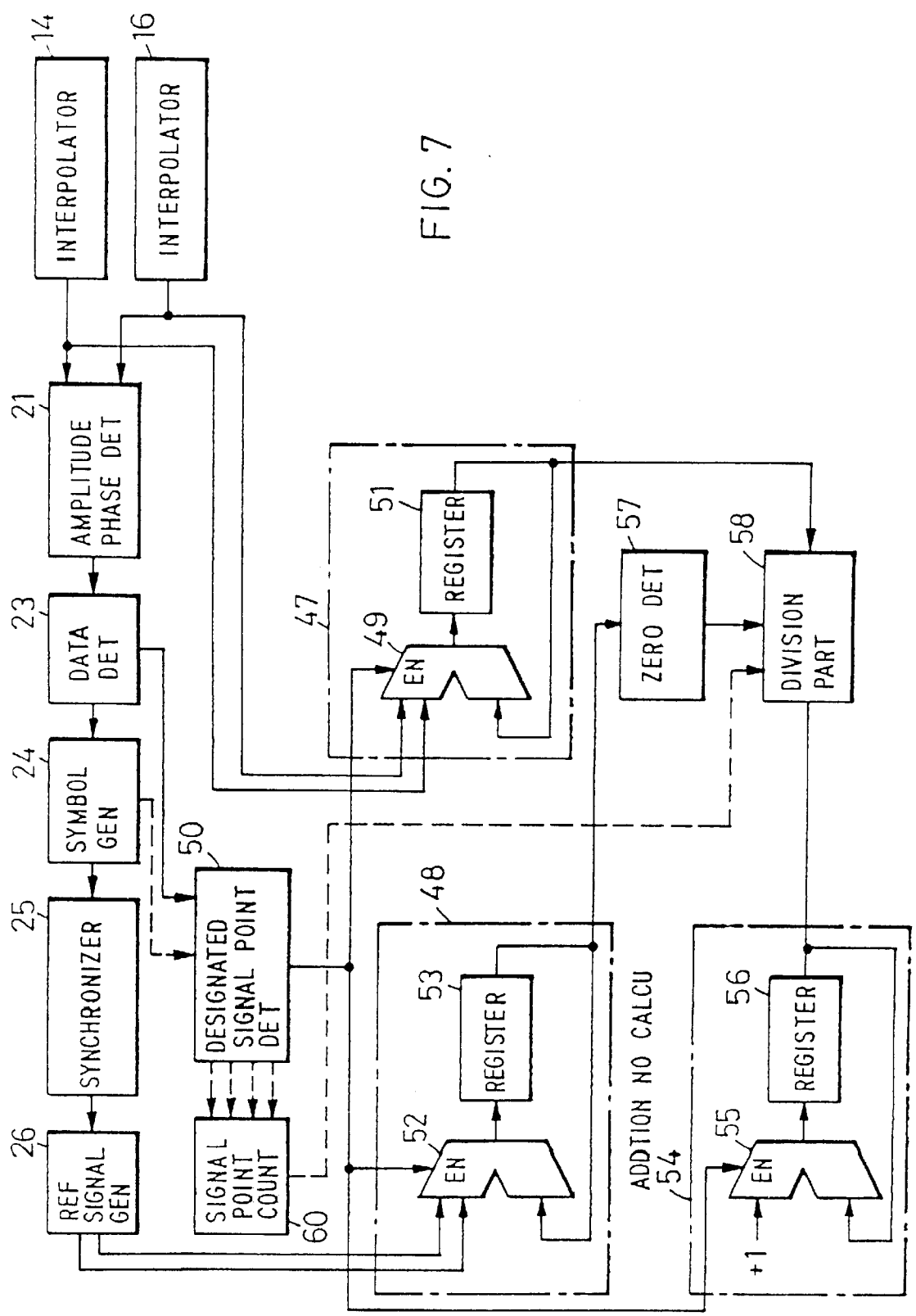
FIG. 7 is a block diagram illustrating another specific operative example of the I-Q origin offset detecting part 41.

While in the above all the detected signals $Z(k)$ and ideal signals $S_r(k)$ are respectively accumulated, it is also possible to accumulate them by the accumulating parts 47 and 48 not at all the signal points that the DQPSK signal can assume but, for example, two or four signal points where the sum of vectors corresponding to the signal points is zero. In this instance, as shown in FIG. 7, the output from the data detecting part 23 or symbol generating part 24 is monitored by a designated signal point detecting part 50 to see if the signal point is a designated one, and if it is so, the output from the designated signal point detecting part 50 is applied to the adders 49, 52 and 55 to enable them to perform the accumulation. That is, in the adder 52, the in-phase signal and the quadrature signal from the ideal reference signal generating part 26 and the accumulated values stored in the register 53 are vector added, respectively. In the adder 49, the in-phase signal and the quadrature signal from the interpolation filters 14 and 16 and the accumulated values stored in the register 51 are vector added, respectively. In the adder 55, a numerical value +1 and the accumulated numerical value stored in the register 56 are added each time the vector signals are added in the adder 55. However, the detection accuracy is higher when all signals are accumulated.

The accumulating part 48 and the accumulation number counting part 54 and the zero detecting part may be omitted. In such an instance, as indicated by the broken lines in FIG. 7, after respective designated signal points are detected by the designated signal point detecting part 50, the number of detections is detected by a counting part 60 for each signal point, and when the number of detections at each signal point has reached the same value, the counting part 60 outputs a sum of the respective numbers of detections of the dividing part 58 and the accumulated value by the accumulating part 47 at that time is divided by the sum of the respective numbers of accumulations in the dividing part 58.

In FIG. 6 the accumulated value by the accumulating part 48 represents the center of the vector composed of in-phase and quadrature components of the ideal signal from the start of the accumulation to that time. Similarly, the accumulated value by the accumulating part 47 also represents the center of the detected vector from the start of the accumulation to that time. Hence, the difference between the centers of the both vectors, that is, the I-Q origin offset can be obtained by dividing the difference between the respective accumulated values of the both accumulating parts 48 and 47 by the number of accumulation. That is, it is also possible to calculate the difference between the accumulated values of the accumulating parts 47 and 48 by a difference calculating part 59 and to provide the subtracted result to the dividing part 58 as indicated by the broken lines in FIG. 6.

Figure 8:
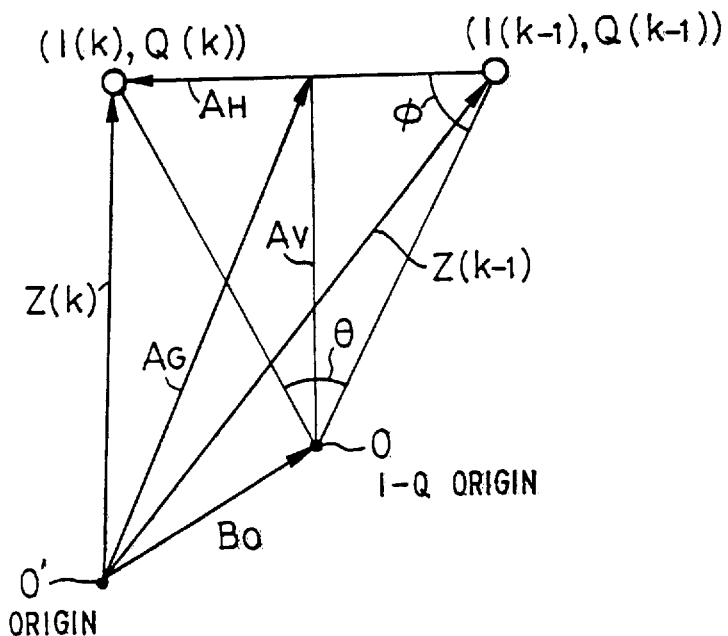
FIG. 8 is a graph showing the relationships of the detected vector Z(k), the immediately preceding detected vector Z(k−1) and the ideal I-Q origin.

As shown in FIG. 8, the vertex of a triangle, which is defined by a vector $A_H$ corresponding to the difference between the detected vector $Z(k)$ determined by the instantaneous amplitude $a(k)$ and the instantaneous phase $\theta(k)$ or the in-phase component $I(k)$ and the quadrature component $Q(k)$ and the detected vector $Z(k-1)$ (where k is a value indicating the instant of time every symbol interval) determined by the instantaneous amplitude and phase one symbol interval before, that is, the basic point of the vectors $Z(k)$ and $Z(k-1)$ is the correct origin O on the I-Q coordinates in an ideal case where the I-Q origin offset $B_0$ is zero, and if it is not zero, the basic point becomes an incorrect origin O'. When the modulated signal is a DQPSK signal, in the ideal case where the origin offset is zero, the angle $\theta$ between the vectors $Z(k)$ and $Z(k-1)$ is 45° when the vector $A_H$ is represented by symbols "0, 0,", 135° for "0, 1,", -135° for "1, 1" and -45° for "1, 0". Because of such relationships, the origin offset $B_0$ can be obtained from the detected vectors $Z(k)$ and $Z(k-1)$. That is, the origin O of the I-Q coordinates is on the line passing through the median of the vector $A_H$, and letting the vector from the median to the origin and the vector from the origin O' to the median of the vector $A_H$ be represented by $A_V$ and $A_G$, respectively, the I-Q origin offset vector $B_0$ is $A_G+A_V$. Since $A_G=(½)[Z(k)+Z(k-1)]$ and $A_H=[Z(k)-Z(k-1)]$, the I-Q origin offset vector $B_0$ is obtained by the following equation:

$$B_0=(½)[Z(k)+Z(k-1)]+\alpha R[Z(k)-Z(k-1)] \quad (4)$$

where $\alpha$ is $(½)\tan\phi, \phi=(½)(180-\theta)$ and R is a matrix which rotates the vector through 90°. Now, letting the I-Q coordinates of the vector $Z(k-1)$ be represented by $\{I(k-1), Q(k-1)\}$, the I-Q coordinates of the vector $Z(k)$ is $\{I(k), Q(k)\}$; hence the in-phase component $I_0$ and the quadrature component $Q_0$ of the origin offset $B_0$ can be given by the following equations.

$$I_0=(½)\{I(k-1)+I(k)\}-\alpha\{Q(k)-Q(k-1)\} \quad (5)$$

$$Q_0=(½)\{Q(k-1)+Q(k)\}+\alpha\{I(k)-I(k-1)\} \quad (6)$$

Figure 9:
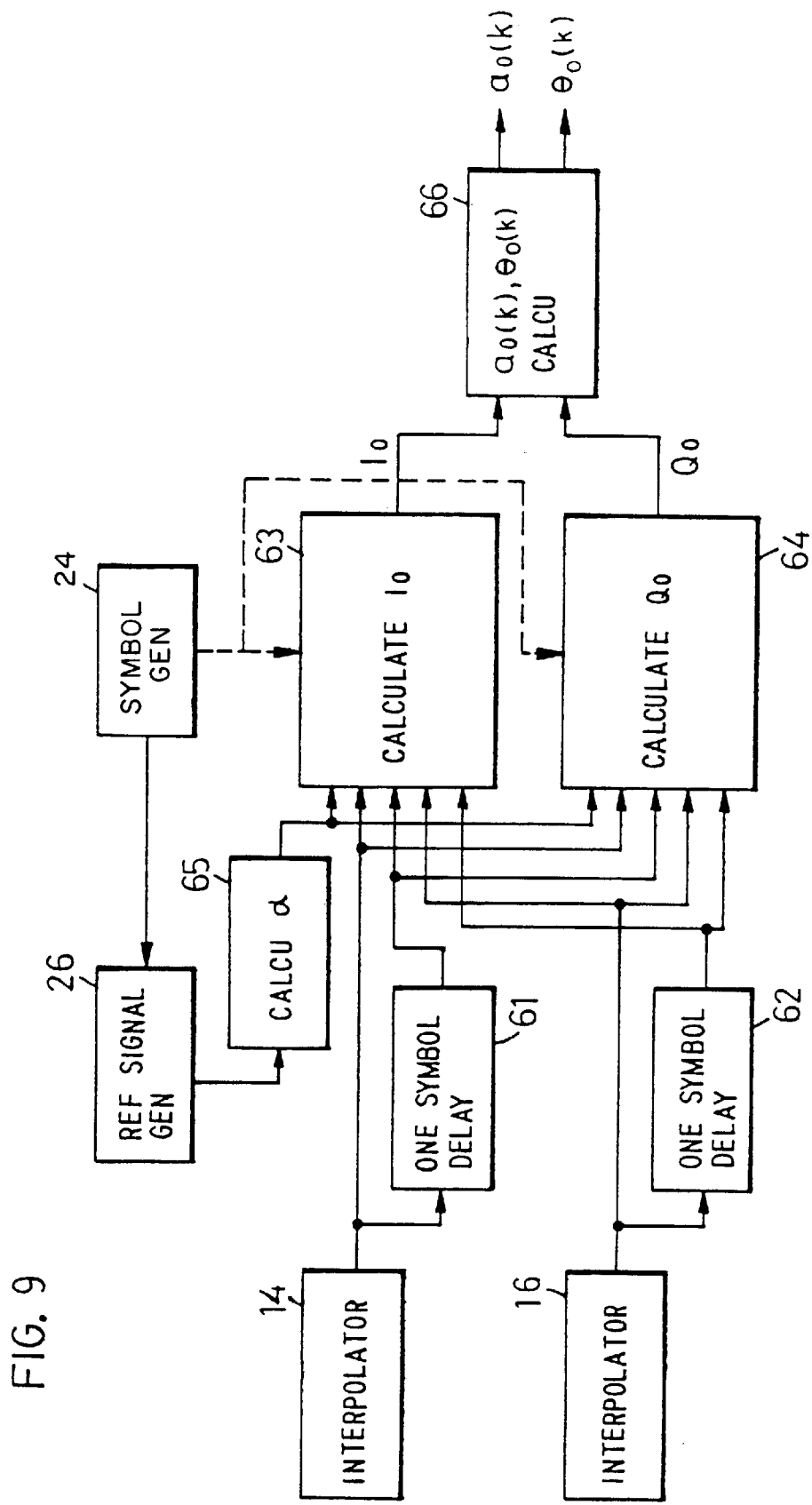
FIG. 9 is a block diagram showing still another specific operative example of the I-Q origin offset detecting part 41.

Thus, as shown in FIG. 9, the in-phase and quadrature components $I(k)$ and $Q(k)$ available from the interpolation filters 14 and 16 input into one symbol delay parts 61 and 62, while at the same time they are fed to an $I_0$ calculating part 63 and a $Q_0$ calculating part 64, respectively, and the ideal instantaneous phase $\theta_r(k)$ is provided from the ideal reference signal generating part 26 to an $\alpha$ calculating part 65. The $\alpha$ calculating part 65 derives $\theta$ from the difference between the ideal instantaneous phase $\theta_r(k)$ and the preceding ideal instantaneous phase $\theta_r(k-1)$ one symbol interval before and, further, calculates $\alpha=(\frac{1}{2})\tan(\frac{1}{2})(180-\theta)$, which is input into the $I_O$ calculating part 63 and the $Q_O$ calculating part 64. Moreover, the outputs from the one symbol delay parts 61 and 62 are both applied to the calculating parts 63 and 64, which calculates the equations (5) and (6), respectively, to obtain $I_O$ and $Q_O$. The outputs from the calculating parts 63 and 64 are used to calculate the amplitude $a_0(k)$ and the phase $\theta_0(k)$ in an offset amplitude and phase calculating part 66, from which they are fed to the adders 42 and 43 in FIG. 4. The in-phase component $I_O$ and the quadrature component $Q_O$ are provided for each symbol interval and the components $I_O$ and $Q_O$ to the adder 42 in that interval have the same value, but they are usually free from variations. Incidentally, the $\alpha$ calculating part 65 is also capable of precalculating the $\alpha$ for each $\theta$ by referring to a table with the later.

Figure 10:
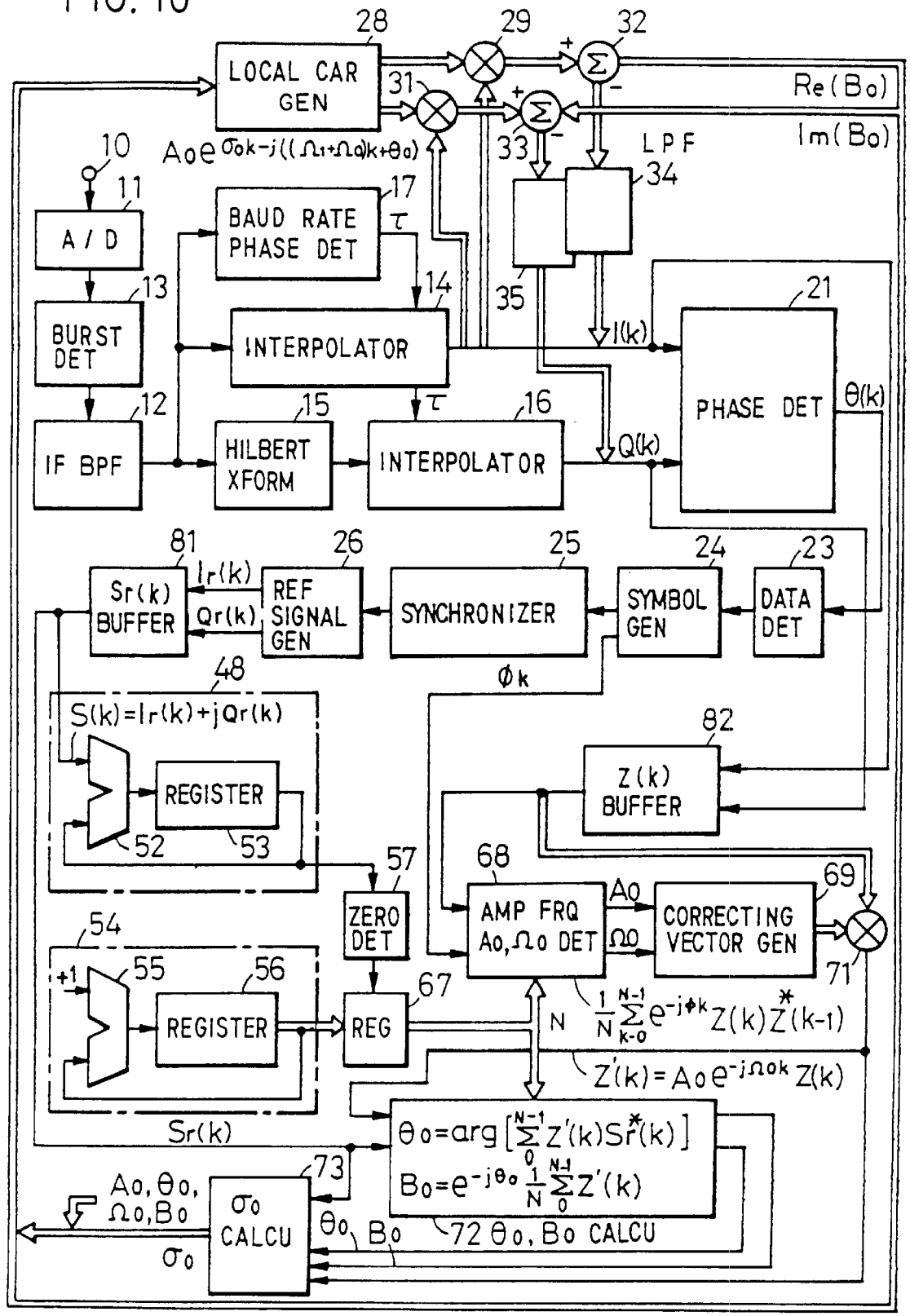
FIG. 10 is a block diagram illustrating another embodiment of the present invention.

FIG. 10 illustrates in block form another embodiment of the present invention, in which the parts corresponding to those in FIG. 6 are identified by the same reference numerals. In this embodiment, k also represents one symbol point. The ideal vector S(k) composed of the ideal in-phase component $I_r(k)$ and the ideal quadrature component $Q_r(k)$ from the ideal reference signal generating part 26 is stored in an ideal vector buffer 81. The detected vector Z(k) composed of the in-phase and quadrature components I(k) and Q(k) from the interpolation filters 14 and 16 is stored in a detected vector buffer 82. The ideal vectors $S_r(k)$ stored in the ideal vector buffer 81 are sequentially accumulated by the accumulator 48 and a numerical value 1 is accumulated by the accumulation number counter 54 in synchronism with each accumulation of the ideal vector $S_r(k)$. The registers 53 and 56 of the accumulator 48 and the accumulation number counter 54 are both initialized to zeros. When the count value of the accumulator 48 goes to a zero, it is detected by the zero detector 57 and the value stored in the register 56 is latched in an accumulation number register 67 by the detector output. When the contents of the ideal vector buffer 81 have all been input into the accumulator 48, the contents of the register 67 is regarded as the value of N that satisfies $\Sigma S_r(k)=0$ (where $\Sigma$ is from k=0 to N−1).

Next, the contents of the detected vector buffer 82 are sequentially read out from the beginning to N−1 and fed to the amplitude and frequency difference detecting part 68. At the same time, an ideal phase $\phi_K$ corresponding to the change from the previous estimated ideal symbol to the current one and the above-said value N of the register 67 are provided to the amplitude and frequency difference detecting part 68 from the symbol generating part 24. In the amplitude and frequency difference detecting part 68, the following complex correlation calculation is averaged. Letting the high order bit and the low order bit in two bits 00 through 11 of the ideal symbol be represented by $h_k$ and $1_k$, respectively, $\phi_k$ can be obtained by $\phi_k=\tan^{-1}\{(2h_k-1)/(2 1_k-1)\}$.

$$C_0 = (1/N) \sum_{k=0}^{N-1} \exp(-j\phi_k)Z(k)Z^*(k-1) \quad (7)$$

where * indicates a complex conjugate. Further, $$A_0 = 1/\sqrt{|C_0|} \quad \Omega_0 = \tan^{-1}\frac{I_m(C_0/|C_0|)}{R_e(C_0/|C_0|)} \quad (8)$$

The detected vector Z(k) can be expressed by the following equation with respect to the ideal vector $S_r(k)$.

$$Z(k)=(1/A_0)[B_0+S_r(k)]\exp[j(\Omega_0 k+\theta_0)]$$

Substitution of this relationship into the equation (7) gives the following equation:

$$C_0 = \frac{\exp(j\Omega_0)}{A_0^2}\left\{|B_0|^2\sum_{k=0}^{N-1}\exp(-j\phi_k) + B_0^* S_r^*(N-1) + N\right\} \quad (9)$$

It is understood that when N is large, the sum of the first term in the braces { } in the equation (9) follows a normal distribution on a central limit theorem, if $\exp(-j\phi_k)$ is regarded as an independent stochastic variable. The normal distribution can perfectly be estimated by its mean and variance. Letting a statistical mean be represented by < >, the mean $\mu$ of the sum of the first term is expressed as follows:

$$\mu = <\sum_{k=0}^{N-1} e^{-j\phi k}> = \sum_{k=0}^{N-1} <e^{-j\phi k}> = 0$$

where it is assumed that $\phi_k$ takes the value ±45° or ±135° with the same probability. Further, a variance $\sigma^2$ of the first term is given by the following equation:

$$\sigma^2 = <\left|\sum_{k=0}^{N-1} e^{-j\phi k}\right|^2> = \sum_{k=1}^{N-1} <e^{j\phi_1-\phi_k}> = N$$

This equation utilizes that the variance is $$<e^{j(\phi_1-\phi_k)}>=<e^{j\phi_1}><e^{-j\phi_k}>=0$$

when k≠1 and N only when 1=k. It is known that possible stochastic variables following the normal distribution fall in the range of from $\mu-4\sigma$ to $\mu+4\sigma$ with a probability of 99.9%. Therefore, $\mu=0$ and $\sigma=N$; hence the above-mentioned first term is on the order of $\sqrt{N}$. Since $B_0$ is also smaller than 1, it is sufficiently smaller than N of the third term in the braces { } of the equation (9) when N is large. Further, the second term in the braces { } of the equation (9) is also sufficiently smaller than N since $S_r(N-1)$ is 1. Thus, the equation (9), that is, the equation (7) is approximated by the following equation when N is large.

$$C_0 = \frac{1}{N}\sum_{k=0}^{N-1} e^{-j\phi k}Z(k)Z^*(k-1) = \frac{e^{j\Omega_0}}{A_0^2} \quad (10)$$

From this, it will be seen that the equation (8) can be used to calculate the amplitude $A_0$ by the square root of a reciprocal of the amplitude of $C_0$ and the frequency difference $\Omega_0$ by the phase angle of $C_0$. Incidentally, the value of N needs only to be greater than 150 or so, for instance. That is, the number of data (vectors) that are stored in each of the buffers 81 and 82 is sufficient to be about 150.

The amplitude $A_0$ and the frequency difference $\Omega_0$ obtained in the amplitude and frequency difference detecting part 68 are used to calculate a corrected vector $A_0\exp(-j\Omega_0 k)$ in a correcting vector generating part 69. The detected vector Z(k) read out from the buffer 82 again is corrected by multiplication with the correcting vector in a multiplier 71.

That is, the amplitude of each detected vector is multiplied by a factor $A_0$ and the phase is rotated in the opposite direction by $\Omega_0$. The thus corrected detected vector $Z'(k)$ and the ideal vector $S_r(k)$ from the ideal reference signal buffer 81 are provided to a phase offset calculating part 72, by which the following calculations are conducted to obtain the phase error $\theta_0$ and the I-Q original offset $B_0$.

$$\theta_0 = arg[\Sigma Z'(k) S_r^*(k)] \quad (11)$$

$$B_0 = \exp(-j\theta_0)(1/N)\Sigma Z'(k) \quad (12)$$

where $\Sigma$ is from $k=0$ to $N-1$. These equations (11) and (12) were derived under the conditions that the droop factor $\sigma_0$ is sufficiently small, $\sigma_0=0$ and $\Sigma S_r(k)=0$ (where $\Sigma$ is from $k=0$ to $N-1$), on the assumption that the parameters $A_0$ and $\Omega_0$ are given in the equation (1). On this account, it is detected that the output from the accumulator 48 goes to zero.

Moreover, in this example, the calculated phase error $\theta_0$, the I-Q origin offset $B_0$, the corrected detected vector $Z'(k)$ and the ideal vector $S_r(k)$ are used to calculate the droop factor $\sigma_0$ by a droop factor calculating part 73. That is, the calculating part 73 calculates $X'(k)=\exp(-j\theta_0)Z'(k)$ and $X_r(k)=S_r(k)+B_0$ and calculates the following equation to obtain the droop factor $\sigma_0$, setting $\exp(\sigma_0 k)=1+\sigma_0(k)$.

$$\sigma_0 = \Sigma(k)[Re(X'(k)X^*_r(k))-|X''(k)|^2]/(k^2|X'(k)|^2) \quad (13)$$

where $\Sigma$ is from $k=0$ to $N-1$. As in the prior art, the thus generated parameters $A_0$, $\theta_0$, $\Omega_0$ and $\sigma_0$ are used to set a constant of the oscillation signal of the local carrier oscillator 28 and the in-phase component $I_0\{=Re(B_0)\}$ and the quadrature component $Q_0\{=Im(B_0)\}$ of the origin offset are produced and fed to the adders 32 and 33.

While in the above the parameters $A_0$ and $\Omega_0$ have been described to be derived from the complex correlation among the currently detected vector, the complex conjugate of the vector detected one symbol clock before and the phase difference of variation between the ideal symbols corresponding to the both detected vectors, it is also possible to derive these parameters from the complex correlation among the currently detected vector, the complex conjugate of a vector detected n symbol clocks before and the accumulation of phase variations over n symbol clocks between ideal symbols corresponding to the both detected vectors.

Figure 11:
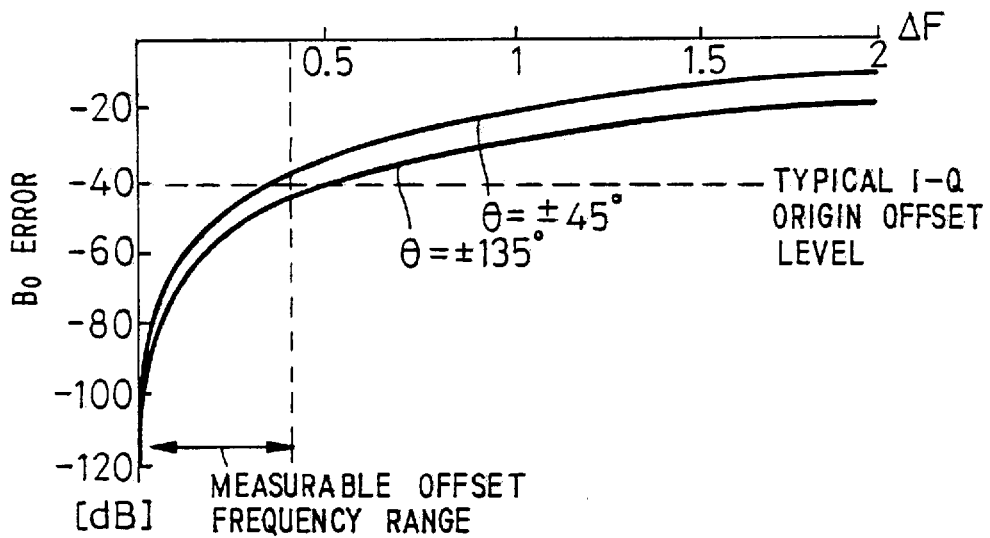
FIG. 11 is a graph showing the relationship between an I-Q origin offset estimation error and a carrier frequency difference.
Figure 12:
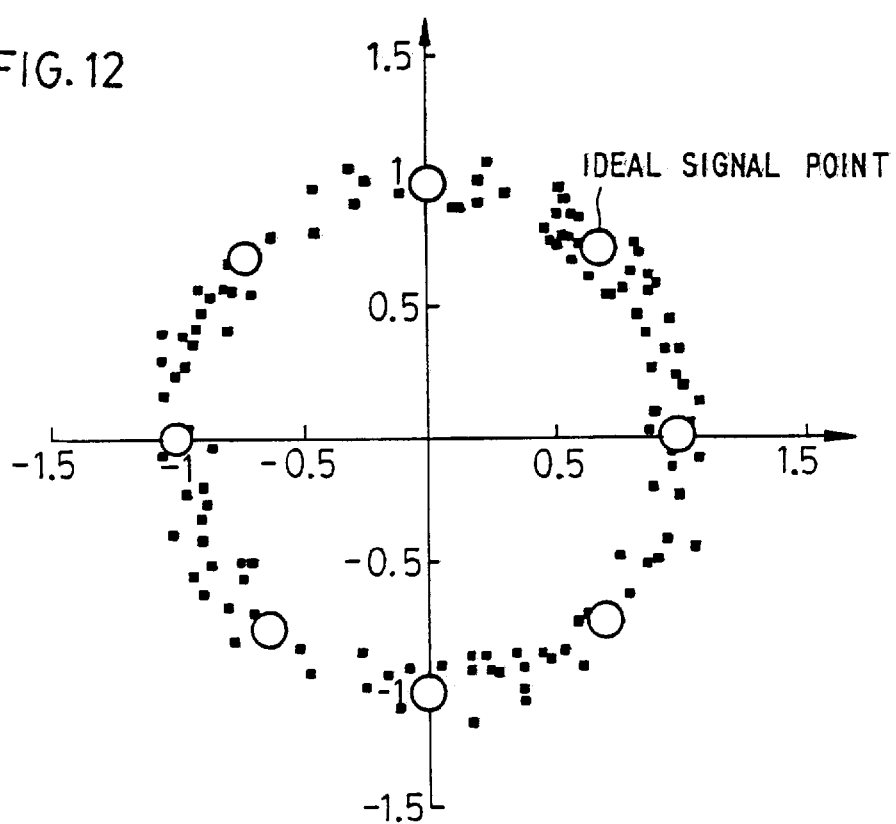
FIG. 12 is a graph showing the relationship between the distribution of detected vectors and ideal signal points.

In the case where the I-Q origin offset is calculated first, then the instantaneous amplitude $a(k)$ and the instantaneous phase $\theta(k)$ are corrected and the corrected instantaneous amplitude and phase are used to calculate parameters in the parameter calculating part 22 as shown in FIG. 4, an estimation error of the I-Q origin offset $B_0$ increases with an increase in a frequency difference $\Delta F$ between the carrier at the transmitting side and the local carrier at the receiving side, as depicted in FIG. 11. As is seen from FIG. 11, it is when the carrier frequency difference $\Delta F$ ($=\Omega_0 \cdot f_s \cdot 2\pi$, where $f_s$ is a symbol rate) is below 4 KHz that the parameters can be obtained by using the instantaneous amplitude and phase corrected by the I-Q origin offset. In the event that the frequency difference $\Delta F$ is relatively large, for example, 1 KHz, detected vectors obtainable with instantaneous amplitude and phase at respective symbol points (i.e. signal points) scatter as shown in FIG. 12. In FIG. 12, white circles are ideal signal points and black dots are tips of the detected vectors $Z(k)$. There is a case where the detected vectors do not center on the ideal signal points as mentioned above and it is unclear which ideal points they belong to. In such an instance, no correct parameters can be obtained and the calculations needs to be repeated as described previously with reference to the prior art example of FIG. 1.

Figure 13:
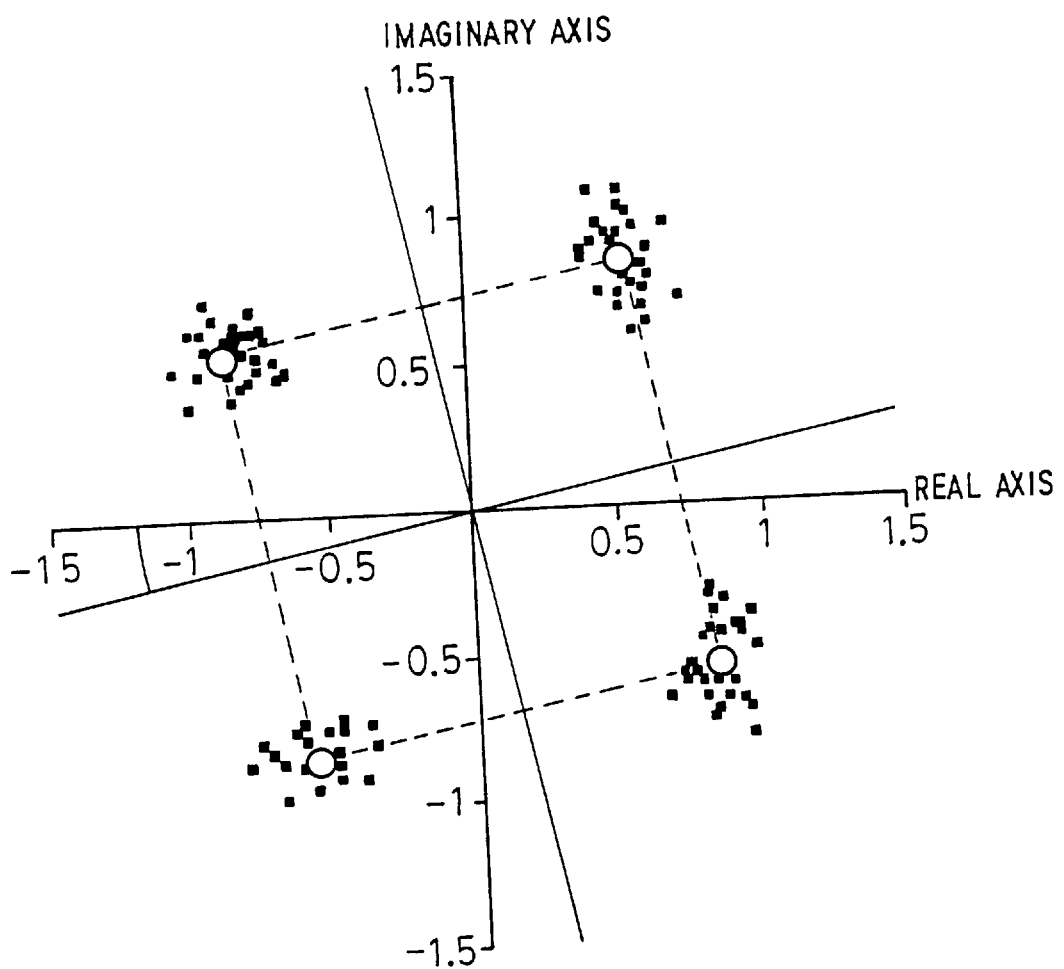
FIG. 13 is a graph showing scattering of the correlation between the detected vector and the complex conjugate of the immediately preceding detected vector.

However, in the case of calculating the complex correlation of the equation (7) in the amplitude and frequency difference detecting part 68 and calculating the amplitude $A_0$ and the frequency difference $\Omega_0$ by the equation (8) as shown in FIG. 10, the required parameters can be obtained correctly even if the frequency difference $\Delta F$ is relatively large. That is, vectors of the correlation between the currently detected vector $Z(k)$ and the complex conjugate $Z^*(k-1)$ of the vector detected one symbol clock before, that is, vectors that have phase difference between the both vectors center on the vicinities of the ideal signal points indicated by the white circles and do not largely scatter as shown in FIG. 13. This phenomenon occurs even if the frequency difference $\Delta F$ is relatively large, and the scattering of vectors is smaller than in the case of FIG. 12. Hence, the frequency difference $\Omega_0$ and the amplitude $A_0$ can correctly be calculated through utilization of such a correlation even when the frequency difference $\Delta F$ is large.

In the FIG. 4 embodiment, it is also possible to obtain the I-Q origin offset a plurality of times and average them. The droop factor $\sigma_0$ hardly varies in many cases; hence, the above-described calculations may be conducted setting $\sigma_0=0$. Any of the embodiments described above can be applied to the BPS modulation and the QPSK modulation as well as the DQPSK modulation. The above-described calculations in the respective parts may be performed using an electronic computer.

As described above, according to a first aspect of the present invention, the I-Q origin offset $B_0$ is obtained first and then the amplitude and phase of this origin offset are subtracted from the instantaneous amplitude and phase of the detected vector to calculate the parameters $A_0$, $\Omega_0$, $\theta_0$ and $\sigma_0$; hence, calculations need not be repeated as in the prior art and the modulation accuracy can be estimated fast accordingly.

According to the other aspect of the present invention, the complex correlation is calculated to obtain the amplitude $A_0$ and the frequency difference $\Omega_0$ first, the detected vector is corrected in accordance with them, and the phase difference $\theta_0$ and the I-Q origin offset $B_0$ are derived from the corrected vector—this precludes the necessity of repeating calculations, enables the modulation accuracy to be estimated more quickly and correctly even if the frequency difference $\Delta F$ is large.

It will be apparent that many modifications and variations may be effected without departing from the scope of the novel concepts of the present invention.

What is claimed is:

1. A Phase-Shift Keying (PSK) modulated signal estimating apparatus comprising:

analog-to-digital (A/D) converting means for converting an input PSK modulated signal to a digital PSK modulated signal;

orthogonal transformation means, receiving the digital PSK modulated signal from said A/D converting means as an in-phase component thereof, for providing a quadrature component of said digital PSK modulated signal;

phase detecting means for detecting an instantaneous phase of the digital PSK modulated signal from said in-phase component and said quadrature component of the digital PSK modulated signal;

symbol generating means for determining an ideal modulation symbol based on said instantaneous phase of said digital PSK modulated signal and the instantaneous phase of the digital PSK modulated signal which was detected one symbol before;

ideal reference signal generating means, supplied with said ideal modulation symbol, for generating an in-phase component and a quadrature component of an ideal reference signal corresponding to said ideal modulation symbol;

a detected vector buffer storing a pair of said in-phase component and said quadrature component of said digital PSK modulated signal as a detected vector;

an ideal vector buffer storing a pair of said in-phase component and said quadrature component of said ideal reference signal as an ideal vector in synchronization with storing said in-phase component and said quadrature component of said digital PSK modulated signal in said detected vector buffer;

accumulating means for accumulating said in-phase component and said quadrature component of the stored ideal reference signal;

counting means for counting a number of accumulations of said accumulating means;

means for effecting operations of said accumulating means and said counting means in synchronization with one another;

detecting means for detecting the number of accumulations of said counting means when an accumulated value of said accumulating means becomes zero;

amplitude and frequency detecting means for averaging, over n (n being a positive integer) symbol clocks, a complex correlation between a currently detected vector comprising said in-phase component and quadrature component of said digital PSK modulated signal read out of said detected vector buffer, a complex conjugate of the vector which was detected n symbol clocks before and an accumulation of phase variations of ideal modulation symbols over said n symbol clocks, and for calculating an amplitude $A_0$ and an offset frequency $\Omega_0$ on the basis of a magnitude and a phase angle of an averaged value of said complex correlation, respectively;

means for generating a correcting vector having a magnitude and a phase angle opposite in polarity from the calculated amplitude $A_0$ and the offset frequency $\Omega_0$;

correcting means for multiplying the detected vector read out of said detected vector buffer by said correcting vector to correct said detected vector; and phase offset and I-Q origin offset calculating means for obtaining a phase error $\theta_0$ by detecting a phase angle of a sum of products, over said n symbol clocks, of the corrected detected vector and a complex conjugate of the ideal vector comprising said in-phase component and said quadrature component of said ideal reference signal read out of said ideal vector buffer, and for obtaining an I-Q origin offset by averaging said corrected detected vector over said n symbol clocks and shifting the averaged vector in-phase by said phase error $\theta_0$.

2. The apparatus of claim 1, wherein said input PSK modulated signal is a Differential Quadrature Phase-Shift Keying (DQPSK) modulated signal.

3. The apparatus of claim 1, further comprising means for correcting a phase of said corrected detected vector by shifting the phase by said phase error $\theta_0$, for adding said I-Q origin offset to said ideal vector to correct said ideal vector and, for computing a droop factor $\sigma_0$ from said corrected ideal vector and the phase-corrected detected vector.

4. A Phase-Shift Keying (PSK) modulated signal estimating method comprising the steps of:

converting an input PSK modulated signal to a digital PSK modulated signal;

obtaining a quadrature component of said digital PSK modulated signal through orthogonal transformation using said digital PSK modulated signal as an in-phase component thereof;

detecting an instantaneous phase of said digital PSK modulated signal from said in-phase component and said quadrature component of said digital PSK modulated signal;

determining an ideal modulation symbol based on said instantaneous phase of said digital PSK modulated signal and on an instantaneous phase of the digital PSK modulated signal which was detected one symbol clock before;

generating an ideal vector comprising an in-phase component and a quadrature component of an ideal reference signal corresponding to said ideal modulation symbol;

storing said ideal vector and a detected vector comprising said in-phase component and said quadrature component of said digital PSK modulated signal in an ideal vector buffer and a detected vector buffer, respectively;

accumulating said ideal vector;

detecting a number of accumulations at which an accumulated value of said ideal vector becomes zero;

reading out said detected vector from said detected vector buffer, averaging, over n (n being a positive integer) symbol clocks, a complex correlation between said detected vector, a complex conjugate of the vector which was detected n symbol clocks before and an accumulation of phase variations of said ideal symbols over said n symbol clocks, and calculating an amplitude $A_0$ and an offset frequency $\Omega_0$ on the basis of a magnitude and a phase angle of an averaged value of said complex correlation, respectively;

generating a correcting vector whose magnitude and phase angle are opposite in polarity from said amplitude $A_0$ and said offset frequency $\Omega_0$;

multiplying the read-out detected vector by said correcting vector to correct said detected vector; and obtaining a phase error $\theta_0$ by detecting a phase angle of a sum of products, over said n symbol clocks, of the corrected detected vector and a complex conjugate of an ideal vector comprising said in-phase component and said quadrature component of said ideal reference signal read out of said ideal vector buffer, and obtaining an I-Q origin offset by averaging said corrected detected vector over said n symbol clocks and shifting the averaged vector in-phase by said phase error $\theta_0$.

5. The method of claim 4, wherein said input PSK modulated signal is a Differential Quadrature Phase-Shift Keying (DQPSK) modulated signal.

* * * * *

UNITED STATES PATENT AND TRADEMARK OFFICE
CERTIFICATE OF CORRECTION

PATENT NO. : 5,838,737
DATED : November 17, 1998
INVENTOR(S) : Takahioro Yamaguchi, et al.

It is certified that error appears in the above-identified patent and that said Letters Patent is hereby corrected as shown below:

On the title page, item [75] inventors, should read—Takahioro Yamaguchi, Sendai-Shi; Shinsuke Tajiri, Sendai-Shi; Juichi Nakada, Kumagaya, all of Japan--.

Signed and Sealed this

Thirty-first Day of August, 1999

*Attest:*

Q. TODD DICKINSON

*Attesting Officer*   *Acting Commissioner of Patents and Trademarks*